(12) United States Patent
Zehentner

(10) Patent No.: US 7,805,541 B2
(45) Date of Patent: Sep. 28, 2010

(54) MODULAR NUMERICAL CONTROL HAVING LOW-JITTER SYNCHRONIZATION

(75) Inventor: Georg Zehentner, Teisendorf (DE)

(73) Assignee: Dr. Johannes Heidenhain GmbH, Traunreut (DE)

( * ) Notice: Subject to any disclaimer, the term of this patent is extended or adjusted under 35 U.S.C. 154(b) by 331 days.

(21) Appl. No.: 11/258,756

(22) Filed: Oct. 25, 2005

(65) Prior Publication Data

US 2006/0093127 A1 May 4, 2006

(30) Foreign Application Priority Data

Oct. 27, 2004 (DE) .................... 10 2004 052 175

(51) Int. Cl.
*G06F 3/00* (2006.01)
*G06F 13/00* (2006.01)
*G06F 13/42* (2006.01)
*G06F 1/04* (2006.01)
*G06F 1/12* (2006.01)
*G06F 5/06* (2006.01)
*H04L 27/00* (2006.01)
*H04L 7/00* (2006.01)
*H04L 25/00* (2006.01)
*H04L 5/00* (2006.01)

(52) U.S. Cl. .................... 710/2; 710/104; 375/259; 375/368; 375/371; 713/400; 713/503

(58) Field of Classification Search ............. 710/2, 710/104; 375/371, 368, 259; 713/400, 503
See application file for complete search history.

(56) References Cited

U.S. PATENT DOCUMENTS 3,992,581 A 11/1976 Davis (Continued)

FOREIGN PATENT DOCUMENTS

DE  37 13 139  11/1987

(Continued)

OTHER PUBLICATIONS

Hayashi, M., et al., "MS Synchronization Networks Using Digital Signal Processing PLL with Different Phase Error Averaging Number In Each Slave Level," *Electronics & Communications in Japan*, Part 1: Communications, vol. 75, No. 3, (Mar. 1992).

(Continued)

*Primary Examiner*—Henry W Tsai
*Assistant Examiner*—Kris Rhu
(74) *Attorney, Agent, or Firm*—Kenyon & Kenyon LLP

(57) ABSTRACT

A modular, numerical control having low-jitter synchronization includes a main computer and at least one controller unit which, starting from the main computer, are interconnected by serial data-transmission channels in the form of a series circuit. The at least one controller unit includes a first receiver unit for receiving a serial data stream arriving from the direction of the main computer, and a first transmitter unit for outputting a serial data stream. Also provided in the at least one controller unit is a clock recovery unit which derives a synchronous clock signal from the serial data stream arriving at the first receiver unit, and supplies it to the first transmitter unit which uses it as a transmission clock signal, so that the serial data stream arriving at the first receiver unit and the serial data stream output by the first transmitter unit are coupled to each other in phase-locked manner.

11 Claims, 3 Drawing Sheets

U.S. PATENT DOCUMENTS

| | | | |
|---|---|---|---|
| 4,783,791 A | 11/1988 | Yoshino | |
| 4,959,846 A * | 9/1990 | Apple et al. | 375/371 |
| 5,068,880 A * | 11/1991 | Kline et al. | 375/368 |
| 5,689,692 A * | 11/1997 | MacTaggart et al. | 713/503 |
| 6,643,787 B1 * | 11/2003 | Zerbe et al. | 713/400 |
| 2002/0037017 A1 | 3/2002 | Kiesel et al. | |
| 2003/0031282 A1 * | 2/2003 | McCormack et al. | 375/355 |
| 2004/0041533 A1 | 3/2004 | Noda et al. | |
| 2004/0128103 A1 | 7/2004 | Bratzdrum | |
| 2004/0234000 A1 * | 11/2004 | Page | 375/259 |
| 2004/0249982 A1 | 12/2004 | Arnold et al. | |
| 2006/0284687 A1 * | 12/2006 | Abel | 331/16 |

FOREIGN PATENT DOCUMENTS

| | | |
|---|---|---|
| DE | 100 48 191 | 4/2002 |
| EP | 0 504 907 | 9/1992 |
| EP | 1 396 644 | 3/2004 |
| EP | 1 408 386 | 4/2004 |
| WO | WO 03/028259 | 4/2003 |

OTHER PUBLICATIONS

Schultze, S., "Fault-Tolerance in Real-Time Communication," *Industrial Electronics*, Jun. 1993.

Search Report, European Patent Application No. 05 01 5837, dated Jul. 4, 2007 (translated).

SERCON816, *SERCOS interface controller Datasheet*, Version 1.2, Sep. 2002.

\* cited by examiner

MODULAR NUMERICAL CONTROL HAVING LOW-JITTER SYNCHRONIZATION

CROSS-REFERENCE TO RELATED APPLICATIONS

The present application claims priority to Application No. 10 2004 052 175.1, filed in the Federal Republic of Germany on Oct. 27, 2004, which is expressly incorporated herein in its entirety by reference thereto.

FIELD OF THE INVENTION

The present invention relates to a modular, numerical control having low-jitter synchronization. Such a numerical control may allow transmission of data from a main computer to individual modules with constant time delay.

BACKGROUND INFORMATION

Numerical controls (NC) are used primarily for controlling machine tools, and may be subdivided essentially into two functional units, a main computer and at least one controller unit.

The main computer makes available the user interfaces such as keyboard and monitor necessary for operating the NC, and is used for creating, storing and processing programs. Located in the controller units are control loops which are used for driving converter modules, that in turn drive motors. The controller units also include digital and/or analog interfaces for acquiring actual values needed continuously during a program execution for controlling the control loops. The actual values to be acquired may be, for example, position values, speed values, acceleration values or also current values. The controller units are also microprocessor-controlled.

During the processing of a program, at regular time intervals that are a function of the processing clock pulse of the main computer, the main computer sends to the controller units setpoint values as input for the control loops. These setpoint values are generated in a setpoint-value generator by subdividing the path between a starting point and the terminal point of a traversing movement. In this connection, one also speaks of composition or block-by-block processing. Concurrently with the arrival of setpoint values, the controller units—at regular time intervals that are a function of the processing clock pulse of the controller units—record actual values for the control loops. As a rule, a plurality of actual values is recorded between the arrival of two setpoint values.

There may be a desire to spatially separate the main computer and the controller units. Thus, it may desirable be provided to combine the main computer together with the keyboard and the monitor in one housing, in order to create a user interface able to be optimally placed for the user from the standpoint of ergonomics. In the same manner, it may be desirable to arrange the controller units close to the converters, to ensure optimal signal quality of the pulse-width-modulated control signals.

Serial interfaces present themselves for the data transmission between spatially separated units, since in this case, cables having only a few conductors may be used, which may be very inexpensive and may be easy to manipulate compared to cables for data transmission via parallel interfaces. In the event that a plurality of controller units are to be operated at one main computer, it may be provided to connect the controller units to the main computer in the form of a series circuit, in which the data transmission is realized by serial point-to-point connections. In one such architecture, the main computer transmits information in the form of a serial data stream to the first controller unit of the series circuit, which relays the information to the next controller unit of the series circuit, etc., until the information arrives at the final controller unit of the series circuit.

European Published Patent Application No. 1 394 644 describes a numerical control that includes a numerical control unit and a plurality of motor control units that are interconnected via serial communication lines in the form of a series circuit. To control the motor control units, the numerical control unit transmits data, especially setpoint values, to the first motor control of the series circuit. It forwards the data to the next motor control, etc., until the data finally reaches the last motor control of the series circuit.

A numerical control of this type may provide the disadvantage that the motor controls, as well as the numerical control unit, are controlled by independent clock signals, i.e., they do not run synchronously relative to each other. Therefore, the motor controls must be synchronized with the numerical control unit at regular time intervals.

Conventional methods for synchronization may be used, e.g., in field bus systems such as PROFIBUS, or also in the Ethernet, which is conventional, e.g., in office technology. For the synchronization, the main computer (bus master) transmits synchronization information to the controller units (slaves) at cyclical time intervals. They synchronize their sequencing control with the aid of the synchronization information, i.e., they correct the phase error or shift between the reception of the setpoint values and the acquisition of actual values which has resulted since the last synchronization due to the frequency deviation of the various clock-pulse generators. The synchronization information is frequently sent in the form of data packets (also referred to as data telegrams). In this context, they may be pure synchronization packets, or data packets containing both synchronization information and user data.

In the system architecture described—series circuit of main computer and controller units—because of the main computer and the controller units being operated by different clock signals independent of one another, a further problem may result in the transmission of the synchronization information. Depending on the phase position of the clock signal of the controller unit, the reception of a data packet and therefore the arrival of the synchronization information is delayed by up to one clock-pulse period. This effect is also referred to by the technical term "jitter."

Also, as a result of the jitter, the data packets, especially the synchronization information contained therein, are not relayed with a constant delay time to the following controller unit of the series circuit. This means that the further a controller unit is from the main computer, i.e., the more controller units the synchronization information passes through, the more unreliably the synchronization functions, because with each controller unit traversed, the maximum time deviation in the transmission of the synchronization information increases. Since the change in the phase position of the clock signals of the main computer and the controller units relative to each other follows largely from the tolerances of the clock-pulse generators and differences in the clock frequency resulting therefrom, this effect is periodic.

One possible consequence of a faulty synchronization is that a disturbance is superimposed on the actual values measured in a controller unit. This may come about by the fact that the moments of the arrival of setpoint values shift relative to the moments of the measuring of actual values in the controller units. In particular, the measured value may be falsified slightly if the arrival of a setpoint value coincides with the conversion of an analog measuring signal into a digital measured value. Since the influencing of the measured values is a function of the jitter, and this changes periodically, one also speaks of a beat effect. The result may be less precision of the machine tool controlled by the numerical control, i.e., a poorer quality, particularly of the surface finish, of parts produced by the machine tool. Since the disturbances have comparatively low frequencies, it may not be possible to filter them out in the control loops, because the control rate may thereby be reduced to the point that the controller unit may no longer be usefully operated.

One design approach for achieving reliable transmission of synchronization information even via multiple controller units is to operate the main computer and the controller units using the same clock signal.

German Published Patent Application No. 100 48 191 describes a method for synchronizing a plurality of bus systems in which synchronization signals are fed from a receiver unit of a bus system to the phase shifter of a phase-locked loop (PLL) having a clock-pulse generator. The phase shifter ascertains the instantaneous phase error and readjusts the clock-pulse generator such that the clock-pulse generator outputs a setpoint number of clock signals between two synchronization signals. The clock signal is fed as a central clock pulse to all transmitter units of the bus systems.

This method may provide the disadvantage that, given high accuracy requirements, the synchronization signals must be transmitted at short time intervals to keep the phase error of the clock pulse generator small. This may be true in particular when working with a system having the architecture described above, since in spite of the synchronization, the phase error of the controller units compared to the clock signal of the main computer increases with each module in the series circuit.

SUMMARY

An example embodiment of the present invention may provide a modular, numerical control by which data, e.g., synchronization information, may be transmitted with a low jitter.

A modular, numerical control having low-jitter synchronization is described below that includes a main computer and at least one controller unit which, starting from the main computer, are interconnected by serial data-transmission channels in the form of a series circuit. The at least one controller unit includes a first receiver unit for receiving a serial data stream arriving from the direction of the main computer, and a first transmitter unit for outputting a serial data stream. Also provided in the at least one controller unit is a clock recovery unit which derives a synchronous clock signal from the serial data stream arriving at the first receiver unit, and supplies it to the first transmitter unit which uses it as a transmission clock signal, so that the serial data stream arriving at the first receiver unit and the serial data stream output by the first transmitter unit are coupled to each other in phase-locked manner.

According to an example embodiment of the present invention, a modular, numerical control unit having low-jitter synchronization includes: a main computer; and at least one controller unit, the at least one controller unit, starting from the main computer, interconnected by serial data transmission channels in the form of a series circuit. The at least one controller unit includes: a first receiver unit adapted to receive a serial data stream arriving from a direction of the main computer; a first transmitter unit adapted to output a serial data stream; and a clock recovery unit adapted to derive a synchronous clock signal from the serial data stream arriving at the first receiver unit and to supply the synchronous clock signal to the first transmitter unit, the synchronous clock signal used by the first transmitter unit as a transmission clock signal, the serial data stream arriving at the first receiver unit and the serial data stream output by the first transmitter unit coupled to each other in phase-locked manner.

The at least one controller unit may include a processor unit to which the synchronous clock signal is supplied, and the processing unit may be adapted to process data included in the received serial data stream, at determined time intervals and to supply the processed data to the first transmitter unit.

The processor unit of the at least one controller unit may be synchronizable by synchronization information transmitted in the serial data stream.

Data in the serial data stream may be transmittable as data packets.

The data packets may include synchronization information.

The serial data stream may be encoded such that level changes occur during transmission gaps.

The serial data stream may have a bit group coding of a 4B5B type.

The at least one controller unit may include: a second receiver unit adapted to receive a second serial data stream arriving from a direction of a final controller unit in the series circuit; a processor unit adapted to process data included in the second serial data stream; and a second transmitter unit adapted to output the processed data in the form of a serial data stream in the direction of the main computer.

The data transmission channels may include a transmit channel and a receive channel. A serial data stream may be transmittable from the main computer in a direction of the controller units by the transmit channel, and a serial data stream may be transmittable from the controller units in the direction of the main computer by the receive channel.

In the final controller unit of the series circuit, an output of the first transmitter unit may be connected to an input of the second receiver unit.

According to an example embodiment of the present invention, a modular, numerical control unit having low-jitter synchronization includes: main computing means; and at least one controlling means, the at least one controlling means, starting from the main computing means, interconnected by serial data transmission means in the form of a series circuit. The at least one controlling means includes: first receiving means for receiving a serial data stream arriving from a direction of the main computing means; first transmitting means for outputting a serial data stream; and clock recovery means for deriving a synchronous clock signal from the serial data stream arriving at the first receiving means and for supplying the synchronous clock signal to the first transmitting means, the synchronous clock signal used by the first transmitting means as a transmission clock signal, the serial data stream arriving at the first receiving means and the serial data stream output by the first transmitting means coupled to each other in phase-locked manner.

Further features and aspects of example embodiments of the present invention are described below with reference to the appended Figures.

DETAILED DESCRIPTION

Figure 1:
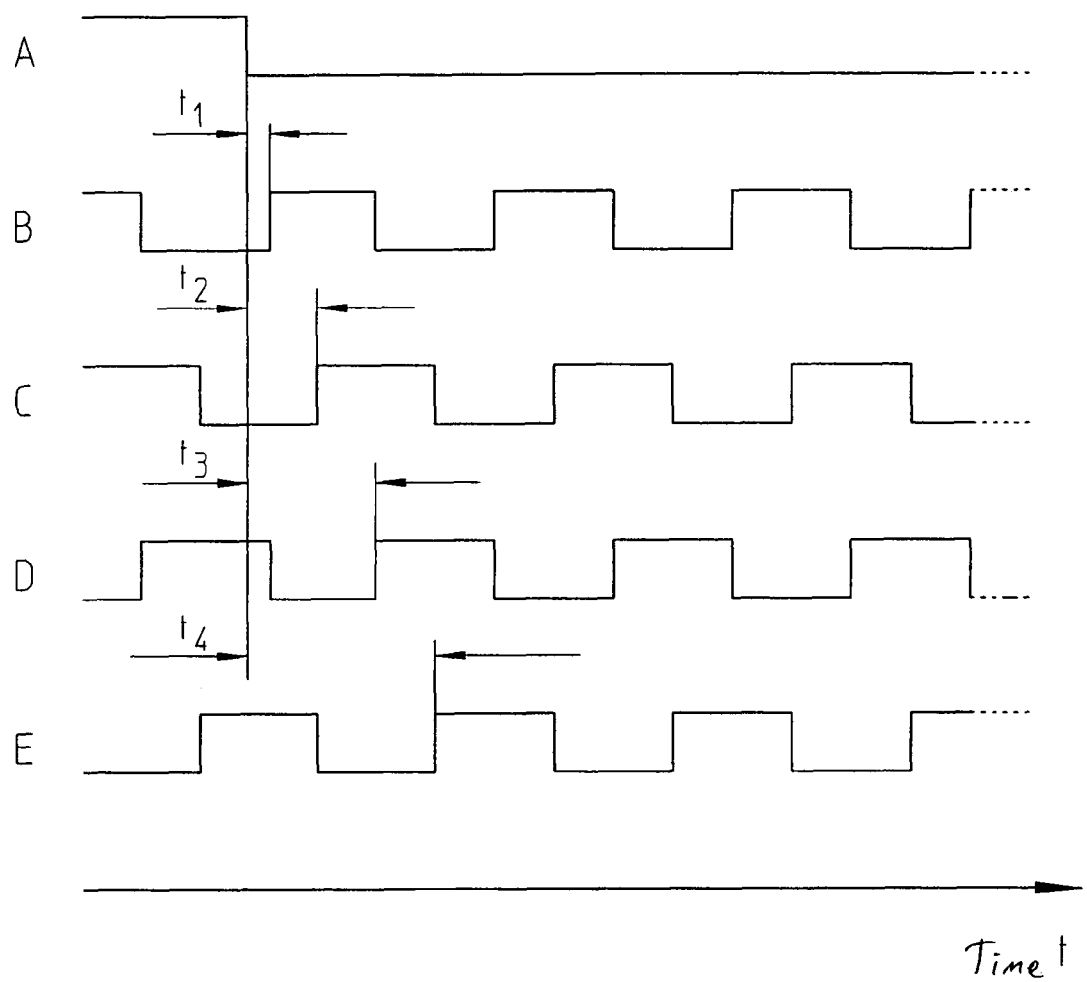
FIG. 1 is a timing diagram for illustrating the cause for jitter in the transmission of synchronization information according to conventional systems.

The reason for the occurrence of jitter in the transmission of synchronization information according to the conventional systems is described above. The timing diagram in FIG. 1 is intended to clarify it more precisely. A signal A signals, by a falling signal edge, the moment of the arrival of a data packet. Signals B, C, D, E show clock signals of a controller unit with different phase position. It is assumed that the processing of the data packet begins with the first rising clock pulse edge of clock signal B, C, D, E. This means that in the case of clock signal B, the processing of the data packet begins after time $t_1$, in the case of clock signal C after the time $t_2$, in the case of clock signal D after the time $t_3$ and in the case of clock signal E after the time $t_4$. It should be apparent that the maximum time deviation between two successively received data packets corresponds to the period duration of clock signal B, C, D, E.

Figure 2:
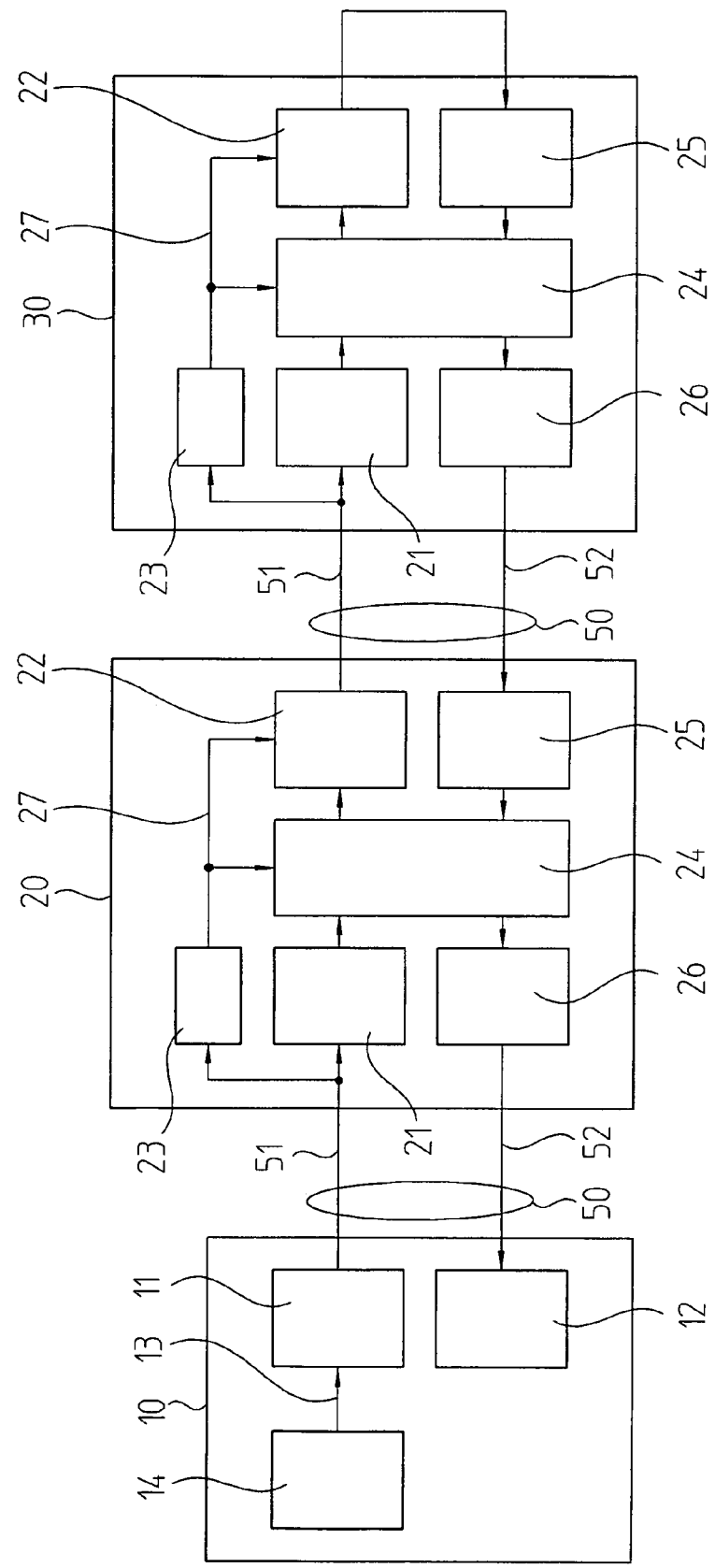
FIG. 2 is a block diagram of a modular, numerical control of an example embodiment of the present invention.

FIG. 2 is a block diagram of a modular numerical control according to an example embodiment of the present invention. It includes a main computer 10 and two controller units 20, 30 which are interconnected by serial data transmission channels 50 in the form of a series circuit. Data transmission channels 50 include a transmit channel 51 and a receive channel 52, transmit channel 51 being used to transmit a serial data stream from main computer 10 in the direction of controller units 20, 30. Receive channel 52 is used to transmit a serial data stream from controller units 20, 30 to main computer 10. Controller unit 30 forms final controller unit 30 of the series circuit. For reasons of clarity, only two controller units 20, 30 are illustrated in FIG. 2. It should be understood that a modular, numerical control may have a multitude of controller units 20, 30.

Main computer 10 includes a main transmitter unit 11 and a main receiver unit 12. A master clock signal 13 generated in a master clock-pulse generator 14 is fed to main transmitter unit 11. Using main transmitter unit 11, main computer 10 sends information in the form of serial data streams via data transmission channel 50 to first controller unit 20 in the series circuit. In this context, the data streams have a data transmission rate identical or proportional to the frequency of master clock signal 13. Any data may be transmitted, such as setpoint values as input for the control loops in controller units 20, 30, data for initializing controller units 20, 30, also commands requesting data from controller units 20, 30, etc. In addition, the data stream may include synchronization information, in order to synchronize controller units 20, 30 with master clock signal 13.

One method for transmitting information with the aid of serial data streams is the so-called packet transmission. The data to be transmitted is incorporated in data packets (also referred to as transmission frames or frames) with exactly defined construction. To increase the transmission reliability, in addition to the user data, such data packets generally have additional information such as a defined start sequence (start bits, startbytes), a defined stop sequence (stop bits, stopbytes), information about the length of the data packet, check sums, etc. Based on this additional information, the receiver of the data packet is able to determine whether the transmission was error-free. If the intention is to send data to several different receivers in one data packet, areas in the transmission frame may be provided for data in common which is sent to all receivers, and areas which are assigned to individual receivers.

Controller units 20, 30 include a first receiver unit 21, a first transmitter unit 22, a clock recovery unit 23, a processing unit 24, as well as a second receiver unit 25 and a second transmitter unit 26.

First receiver unit 21 is used to receive serial data streams arriving from the direction of main computer 10, and to relay the data contained therein to processing unit 24. There, the data is processed at determined time intervals and subsequently relayed to first transmitter unit 22, which in turn sends it on in the form of a serial data stream to the next controller unit 20, 30. To that end, clock recovery unit 23 feeds first transmitter unit 22 a synchronous clock signal 27 which clock recovery unit 23 acquires from the serial data stream. Thus, synchronous clock signal 27 is coupled in phase-locked manner to master clock signal 13. Phase-locked coupling in this connection means that although synchronous clock signal 27 is time-delayed compared to master clock signal 13, this delay is constant and no phase jumps may occur. In other words, only a very low jitter may occur between synchronous clock signal 27 and master clock signal 13. Since first transmitter unit 22 uses synchronous clock signal 27 to transmit the data stream to the next controller unit 20, 30, it may be ensured that all data streams, starting from main computer 10 up to final controller unit 30 of the series circuit have a low jitter relative to each other.

Moreover, synchronous clock signal 27 is also supplied to processing unit 24 of controller units 20, 30. There, with the aid of synchronous clock signal 27, at least one clock signal is generated for controlling the sequences in processing unit 24. In this manner, all processing units 24 also may have a low jitter with respect to master clock signal 13. Conventional measures may be used to generate the at least one clock signal. It may be provided to feed synchronous clock signal 27 to a phase-locked loop (PLL), since a PLL continues to output clock signals even in the event synchronous clock signal 27 is lost. This may ensure that controller units 20, 30 remain functional even in case of a fault, e.g., interruption of a data transmission channel 50 or breakdown of main computer 10, and, if necessary, may be able, in controlled fashion, to stop the drives controlled by them.

Since clock recovery unit 23 obtains synchronous clock signal 27 from the arriving serial data stream, it may be provided that the serial data stream is encoded such that even during transmission gaps, thus in the time in which no data packet is transmitted, level changes occur. Otherwise, a phase error may occur between master clock signal 13 and synchronous clock signal 27, which may become all the greater, the longer the transmission gap lasts. It may be suitable to use a bit group coding of type 4B5B for the serial data stream. In this context, the data to be transmitted is divided up in groups of 4 bits, which are in each case encoded with 5 bits, with the goal of producing as many level changes as possible, and thus to promote a clock recovery.

A serial data interface which uses this type of bit group coding is conventional, e.g., from the field of Local Area Networks (LAN), and bears the name FAST ETHERNET (Standard IEEE Std. 802.3-2002). It may be that the data transmission method as described in the Standard IEEE 802.3 is only conditionally suitable for time-critical applications, since it was developed predominantly for office technology for transmitting large quantities of data, and thereby has no determined time response. On the basis of the physical level of the standard IEEE 802.3 (layer 1 of the OSI/ISO layer model), however, it is possible to arrange a real-time-capable data transmission system. This may provide that it is possible to fall back upon a tried and tested technology, for which a large number of components may be available on the market at a favorable price.

In order to transmit synchronization information from main computer 10 to controller units 20, 30 in a modular numerical control as illustrated in FIG. 2, it may be possible to use conventional methods, e.g., synchronization packets and data packets which, besides user data, also include synchronization information. The serial data streams coupled in phase-locked manner, and the use of synchronous clock signal 27 in processing units 24 may ensure that the synchronization information always arrives with a constant delay time at controller units 20, 30.

It may be provided to be able to transmit information both from main computer 10 to controller units 20, 30 and in the reverse direction. The possibility of being able to transmit information from controller units 20, 30 to main computer 10 may be achieved because in final controller unit 30 in the series circuit, the output of first transmitter unit 22 is connected to the input of second receiver unit 25. Additionally, in the case of adjacent controller units 20, 30, second transmitter units 26 are connected to second receiver units 25. Second transmitter unit 26 of first controller unit 20 in the series circuit is ultimately connected to main receiver unit 12 of main computer 10. The connections are in each case produced by receive channels 52 of data transmission channels 50. In this manner, a ring structure is formed, via which the data stream originally transmitted from main transmitter unit 11 of main computer 10 may be sent back again to main computer 10. Since the data contained in the serial data stream passes through each controller unit 20, 30 both in the forward and in the reverse direction, and is processed in each controller unit 20, 30 in processing units 24, a data transfer is thereby possible between main computer 10 and controller unit 20, and between controller units 20, 30.

Moreover, by evaluating the information which arrives at main receiver unit 12 via the data stream, it is possible to determine whether the data transmission between main computer 10 and controller units 20, 30 is functioning free of error.

As illustrated in FIG. 2, no phase-locked coupling of the data streams is provided for the transmission of information from controller units 20, 30 to main computer 10, since here, slight fluctuations in the transmission time may frequently be tolerated. It should be appreciated that a phase-locked coupling of the data streams may be achieved here as well using the measures described above.

Figure 3:
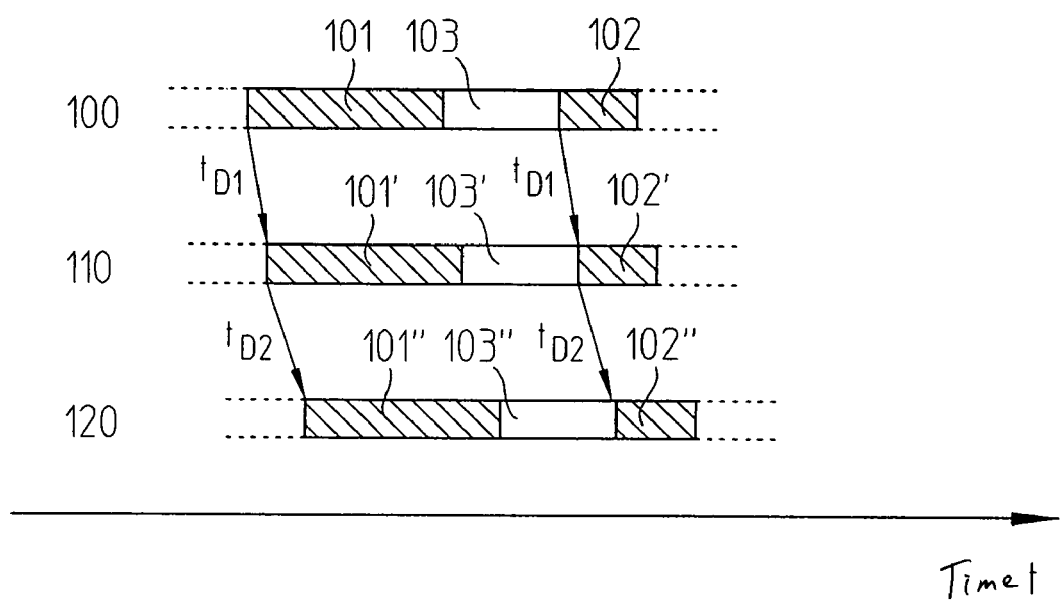
FIG. 3 is a timing diagram for illustrating the time correlation of the data streams.

The time correlation of the data streams is illustrated based on a timing diagram with reference to FIG. 3. A first signal 100 illustrates the timing of the data stream sent off by main transmitter unit 11 of main computer 10. A second signal 110 illustrates the time characteristic of the data stream at the output of first transmitter unit 22 of first controller unit 20 of the series circuit, a third signal 120 the data stream at the output of first transmitter unit 22 of final controller unit 30 of the series circuit. In the data streams illustrated, information is transmitted in the form of data packets 101, 102, 101', 102', 101", 102". Transmission gaps 103, 103', 103" may be located between data packets 101, 102, 101', 102', 101", 102". As FIG. 3 illustrates, the starting time for the transmission of data packet 101' of second signal 110 is delayed by a first delay time $t_{D1}$ compared to the starting time for the transmission of data packet 101 of first signal 100. The starting time for the transmission of data packet 101" of third signal 120 is delayed by a second delay time $t_{D2}$ compared to the starting time for the transmission of data packet 101' of second signal 110. Since the serial data streams are coupled to each other in phase-locked manner, and the data is processed in processing unit 24 of controller units 20, 30 at determined time intervals, it may be ensured that delay times $t_{D1}$ and $t_{D2}$ are constant.

What is claimed is:

1. A modular, numerical control unit having low-jitter synchronization, comprising:
    a main computer; and
    at least one controller unit, the at least one controller unit, starting from the main computer, interconnected by serial data transmission channels in the form of a series circuit, the at least one controller unit including:
    a first receiver unit adapted to receive a serial data stream arriving from a direction of the main computer, an input to the first receiver unit connected to a first one of the serial data transmission channels;
    a first transmitter unit connected to a second one of the serial data transmission channels and adapted to output a serial data stream; and
    a clock recovery unit having an input connected to the first one of the serial data transmission channels and an output connected to an input of the first transmitter unit, the clock recovery unit adapted to derive a synchronous clock signal from the serial data stream arriving at the first receiver unit and to supply the synchronous clock signal to the first transmitter unit, the synchronous clock signal used by the first transmitter unit as a transmission clock signal, the serial data stream arriving at the first receiver unit and the serial data stream output by the first transmitter unit coupled to each other in phase-locked manner;
    wherein the at least one controller unit includes a processor unit to which the synchronous clock signal is supplied, the processor unit adapted to process data included in the received serial data stream, at determined time intervals and to supply the processed data to the first transmitter unit; and
    wherein the at least one controller includes at least one control loop, the data included in the received serial data stream and processed by the processor unit includes set point values for the at least one control loop.

2. The modular, numerical control unit according to claim 1, wherein the processor unit of the at least one controller unit is adapted to synchronize information transmitted in the serial data stream.

3. The modular, numerical control unit according to claim 1, wherein data in the serial data stream is transmittable as data packets.

4. The modular, numerical control unit according to claim 3, wherein the data packets include synchronization information.

5. The modular, numerical control unit according to claim 1, wherein the serial data stream is encoded such that level changes occur during transmission gaps.

6. The modular, numerical control unit according to claim 5, wherein the serial data stream has a bit group coding of a 4B5B type.

7. The modular, numerical control unit according to claim 1, wherein the at least one controller unit includes:
    a second receiver unit adapted to receive a second serial data stream arriving from a direction of a final controller unit in the series circuit;
    a processor unit adapted to process data included in the second serial data stream; and
    a second transmitter unit adapted to output the processed data in the form of a serial data stream in the direction of the main computer.

8. The modular, numerical control unit according to claim 7, wherein the data transmission channels include a transmit channel and a receive channel, a serial data stream transmittable from the main computer in a direction of the controller units by the transmit channel, a serial data stream transmittable from the controller units in the direction of the main computer by the receive channel.

9. The modular, numerical control unit according to claim 7, wherein in the final controller unit of the series circuit, an output of the first transmitter unit is connected to an input of the second receiver unit.

10. A modular, numerical control unit having low-jitter synchronization, comprising:
    main computing means; and
    at least one controlling means, the at least one controlling means, starting from the main computing means, interconnected by serial data transmission means in the form of a series circuit, the at least one controlling means including:
    first receiving means for receiving a serial data stream arriving from a direction of the main computing means, an input to the first receiving means connected to a first channel of the serial data transmission means;
    first transmitting means for outputting a serial data stream, the first transmitting means connected to a second channel of the serial data transmission means; and
    clock recovery means for deriving a synchronous clock signal from the serial data stream arriving at the first receiving means and for supplying the synchronous clock signal to the first transmitting means, the synchronous clock signal used by the first transmitting means as a transmission clock signal, the serial data stream arriving at the first receiving means and the serial data stream output by the first transmitting means coupled to each other in phase-locked manner, the clock recovery means having an input connected to the first channel and an output connected to an input of the first transmitting means;
    wherein the at least one controlling means includes processing means to which the synchronous clock signal is supplied, the processing means for processing data included in the received serial data stream, at determined time intervals and for supplying the processed data to the first transmitting means; and
    wherein the at least one controlling means includes at least one control loop, the data included in the received serial data stream and processed by the processing means includes set point values for the at least one control loop.

11. A modular, numerical control unit having low-jitter synchronization, comprising:
    a main computer including a master clock-pulse generator; and
    a plurality of controller units, the controller units, starting from the main computer, interconnected by serial data transmission channels in the form of a series circuit, each controller unit including:
    a first receiver unit adapted to receive a serial data stream arriving from a direction of the main computer, an input to the first receiver unit connected to a first one of the serial data transmission channels;
    a first transmitter unit connected to a second one of the serial data transmission channels and adapted to output a serial data stream; and
    a clock recovery unit having an input connected to the first one of the serial data transmission channels and an output connected to an input of the first transmitter unit, the clock recovery unit adapted to derive a synchronous clock signal from the serial data stream arriving at the first receiver unit and to supply the synchronous clock signal to the first transmitter unit, the synchronous clock signal used by the first transmitter unit as a transmission clock signal, the serial data stream arriving at the first receiver unit and the serial data stream output by the first transmitter unit coupled to each other in phase-locked manner;
    wherein the synchronous clock signal derived by the clock recovery unit of each controller unit is coupled in phase-locked manner to a master clock signal generated by the master clock-pulse generator.

* * * * *